(12) United States Patent
Niimi et al.

(10) Patent No.: US 11,171,060 B2
(45) Date of Patent: Nov. 9, 2021

(54) DUAL METAL CONTACTS WITH RUTHENIUM METAL PLUGS FOR SEMICONDUCTOR DEVICES

(71) Applicant: Tokyo Electron Limited, Tokyo (JP)

(72) Inventors: Hiroaki Niimi, Albany, NY (US); Gyanaranjan Pattanaik, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/803,993

(22) Filed: Feb. 27, 2020

(65) Prior Publication Data

US 2020/0279782 A1 Sep. 3, 2020

Related U.S. Application Data

(60) Provisional application No. 62/812,126, filed on Feb. 28, 2019.

(51) Int. Cl.

| | |
|---|---|
| *H01L 21/8238* | (2006.01) |
| *H01L 29/08* | (2006.01) |
| *H01L 29/417* | (2006.01) |
| *H01L 29/45* | (2006.01) |
| *H01L 21/3205* | (2006.01) |
| *H01L 29/167* | (2006.01) |

(Continued)

(52) U.S. Cl.
CPC ........ *H01L 21/823814* (2013.01); *H01L 21/02532* (2013.01); *H01L 21/32051* (2013.01); *H01L 21/32053* (2013.01); *H01L 27/0924* (2013.01); *H01L 29/0847* (2013.01); *H01L 29/167* (2013.01); *H01L 29/41783* (2013.01); *H01L 29/45* (2013.01)

(58) Field of Classification Search
CPC ....... H01L 21/823814; H01L 21/02532; H01L 21/32051; H01L 21/32053; H01L 27/0924; H01L 29/0847; H01L 29/167; H01L 29/41783; H01L 29/45
USPC ........................................................ 257/369
See application file for complete search history.

(56) References Cited

U.S. PATENT DOCUMENTS 10,566,246 B1 * 2/2020 Wu ...................... H01L 29/456
2017/0077248 A1 3/2017 Eom et al.
(Continued)

OTHER PUBLICATIONS

Korean Intellectual Property Office, International Search Report and Written Opinion for International application No. PCT/US2020/020245, dated Jun. 19, 2020, 10pp.

*Primary Examiner* — Igwe U Anya

(57) ABSTRACT

A semiconductor device and a method of forming a semiconductor device. The semiconductor device includes a first raised feature in a n-type channel field effect transistor (NFET) region on a substrate, a first doped epitaxial semiconductor material grown on the first raised feature, a first metal contact on the first doped epitaxial semiconductor material, a first metal nitride on the first metal contact, and a first ruthenium (Ru) metal plug on the first metal nitride. The device further includes a second raised feature in a p-type channel field effect transistor (PFET) region on the substrate, a second doped epitaxial semiconductor material grown on the second raised feature, a second metal contact on the second doped epitaxial semiconductor material, a second metal nitride on the second metal contact, and a second ruthenium (Ru) metal plug on the second metal nitride.

6 Claims, 6 Drawing Sheets

(51) Int. Cl.
  *H01L 21/02*   (2006.01)
  *H01L 27/092*  (2006.01)

(56) References Cited

U.S. PATENT DOCUMENTS

| | | |
|---|---|---|
| 2017/0125289 A1 | 5/2017 | Adusumilli et al. |
| 2018/0138093 A1 | 5/2018 | Adusumilli et al. |
| 2018/0269297 A1 | 9/2018 | Zhang et al. |
| 2019/0035634 A1 | 1/2019 | Adusumilli et al. |
| 2019/0148522 A1* | 5/2019 | Wu .................. H01L 21/76897 257/365 |
| 2019/0296012 A1* | 9/2019 | Iwata .................. H01L 29/0847 |
| 2020/0098913 A1* | 3/2020 | Xie .................. H01L 21/76224 |
| 2020/0279942 A1 | 9/2020 | Niimi et al. |
| 2020/0279943 A1 | 9/2020 | Niimi |

\* cited by examiner

DUAL METAL CONTACTS WITH RUTHENIUM METAL PLUGS FOR SEMICONDUCTOR DEVICES

CROSS-REFERENCE TO RELATED APPLICATIONS

This application is related to and claims priority to U.S. Provisional Patent Application Ser. No. 62/812,126 filed on Feb. 28, 2019, the entire contents of which are herein incorporated by reference.

FIELD OF THE INVENTION

The present invention relates to semiconductor devices and methods for manufacturing those devices, and more particularly, to low-resistivity dual metal contacts with ruthenium metal plugs for aggressively scaled devices.

BACKGROUND OF THE INVENTION

Current and future generations of metal-oxide-semiconductor field effect transistors (MOSFETs) require tight control of parasitic capacitance while simultaneously optimizing metal-semiconductor contact resistance. Source and drain contact resistivity is one of the critical parameter that needs to be addressed to improve performance of scaled FinFETs and silicon nanowire/nanosheet devices. The adoption of ultra-thin transistor body structures such as FinFET and fully depleted silicon-on-insulator (FDSOI) has exacerbated the problem of contact resistance for logic manufacturing.

SUMMARY OF THE INVENTION

A semiconductor device and a method for forming a semiconductor device are described in several embodiments of the invention.

According to one embodiment, the semiconductor device includes a first raised feature in a n-type channel field effect transistor (NFET) region on a substrate, a first doped n-type epitaxial semiconductor material grown on the first raised feature, a first metal contact metal contact on the first doped n-type epitaxial semiconductor material, a first metal nitride on the first n-type metal contact, a first ruthenium (Ru) metal plug on the first metal nitride. The device further includes a second raised feature in a p-type channel field effect transistor (PFET) region on the substrate, a second p-type doped epitaxial semiconductor material grown on the second raised feature, a second p-type metal contact on the second p-type doped epitaxial semiconductor material, a second metal nitride on the second p-type metal contact, and a second ruthenium (Ru) metal plug on the second metal nitride.

According to one embodiment, a method of forming a semiconductor device includes providing a first raised feature in a n-type channel field effect transistor (NFET) region on a substrate, growing a first n-type doped epitaxial semiconductor material on the first raised feature, depositing a first n-type metal contact containing titanium (Ti) metal on the first n-type doped epitaxial semiconductor material, depositing a first metal nitride on the first n-type metal contact, and depositing a first ruthenium (Ru) metal plug on the first metal nitride. The method further includes providing second raised feature in a p-type channel field effect transistor (PFET) region on the substrate, growing a second p-type doped epitaxial semiconductor material on the second raised feature, depositing a second p-type metal contact containing a Ru metal or ruthenium silicide ($RuSi_x$) on the second p-type doped epitaxial semiconductor material, depositing a second metal nitride on the second p-type metal contact, and depositing a second ruthenium (Ru) metal plug on the second metal nitride.

According to another embodiment, a method of forming a semiconductor device includes providing a patterned substrate containing a first etched feature connecting to a first n-type doped epitaxial semiconductor material at the bottom of the first etched feature and a second etched feature connecting to a second p-type doped epitaxial material at the bottom of the second etched feature, conformally depositing first n-type metal contact containing titanium (Ti) metal layer in the first and second etched features, including on the first and second p-type doped epitaxial materials, and non-conformally depositing a first metal nitride on the first n-type metal contact in the first and second etched features. The method further includes selectively forming a blocking layer on the first etched feature but not on the second etched feature, removing the metal nitride from the second etched feature, removing the blocking layer from the first etched feature, and removing the first n-type metal contact from the second etched feature while retaining the first n-type metal contact on the first n-type doped epitaxial material underneath the metal nitride at the bottom of the first etched feature. The method further includes non-conformally depositing a second p-type layer (e.g., Ru metal) in the first and second etched features, annealing the patterned substrate to at least partly form a metal silicide (e.g., a ruthenium silicide ($RuSi_x$)) at the bottom of the second etched feature, depositing a second metal nitride on the $RuSi_x$, and filling the first and second etched features with Ru metal plugs.

BRIEF DESCRIPTION OF THE DRAWINGS

In the accompanying drawings.

DETAILED DESCRIPTION OF SEVERAL EMBODIMENTS

A semiconductor device and a method for forming a semiconductor device is described in several embodiments of the invention. The device has low Schottky barrier height (SBH), low contact resistivity, and a low resistivity ruthenium (Ru) metal plug.

Figure 1A:
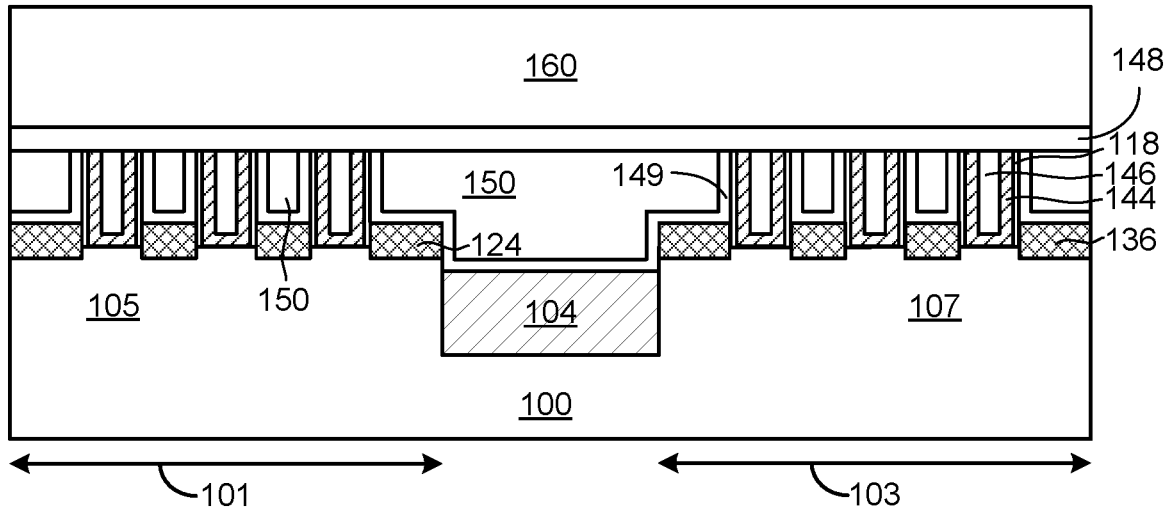
FIGS. 1A-1L schematically show through cross-sectional views a method of forming a semiconductor device containing dual metal contacts with ruthenium (Ru) metal plugs according to an embodiment of the invention.

FIGS. 1A-1L schematically show through cross-sectional views a method of forming a semiconductor device containing dual metal wrap-around contacts according to an embodiment of the invention. FIG. 1A schematically shows a substrate 1 containing a base layer 100 that forms a first raised feature 105 in a NFET region 101 and a second raised feature 107 in a PFET region 103. The base layer 100 can consist of Si and and a shallow trench isolation (STI) region 104 separating the NFET region 101 and the PFET region 103 can include silicon oxide ($SiO_2$). The substrate 1 further contains a low-k gate spacer layer 118 that forms sidewall spacers and can, for example, include SiCO or SiBCN materials.

FIG. 1A further shows a first n-type doped epitaxial semiconductor material 124 on exposed surfaces of the first raised feature 105 (e.g., Si fin) in the NFET region 101 and a second p-type doped epitaxial semiconductor material 136 on exposed surfaces of the second raised feature 107 (e.g., Si fin) in the PFET region 103. The first n-type doped epitaxial semiconductor material 124 can, for example, contain n-type Si that includes phosphorous-doped silicon (Si:P) or arsenic-doped silicon (Si:As). The growth of the first n-type doped epitaxial semiconductor material 124 on the first raised feature 105 can result in the first n-type doped epitaxial semiconductor material 124 wrapping around the first raised feature 105, where the first n-type doped epitaxial semiconductor material 124 has upward facing surfaces and downward facing surfaces. Si:P may be selectively deposited using $SiH_4$, $Si_2H_6$, or $SiH_2Cl_2$ and $PH_3$. Si:As may be selectively deposited using $SiH_4$, $Si_2H_6$ or $SiH_2Cl_2$ and $AsH_3$. The second p-type doped epitaxial semiconductor material 136 can, for example, contain p-type Si that includes boron-doped silicon (Si:B) or p-type silicon germanium that includes boron-doped silicon germanium (SiGe:B). The growth of the second p-type doped epitaxial semiconductor material can result in the second p-type doped epitaxial semiconductor material 136 being faceted and wrapping around the second raised feature 107, where the second p-type doped epitaxial semiconductor material 136 has upward facing surfaces and downward facing surfaces. Si:B may be selectively deposited using $SiH_4$, $Si_2H_6$, or $SiH_2Cl_2$ and $BH_3$ or $B_2H_6$. SiGe:B may be selectively deposited using $SiH_4$, $Si_2H_6$, or $SiH_2Cl_2$ and $GeH_4$ and $BH_3$ or $B_2H_6$.

FIG. 1A further shows a SiN liner 149, a gap-fill oxide film 150, a high-k layer 144, a metal gate layer 146, and an interlayer dielectric (ILD) 160 on the SiN liner 148.

Figure 1B:
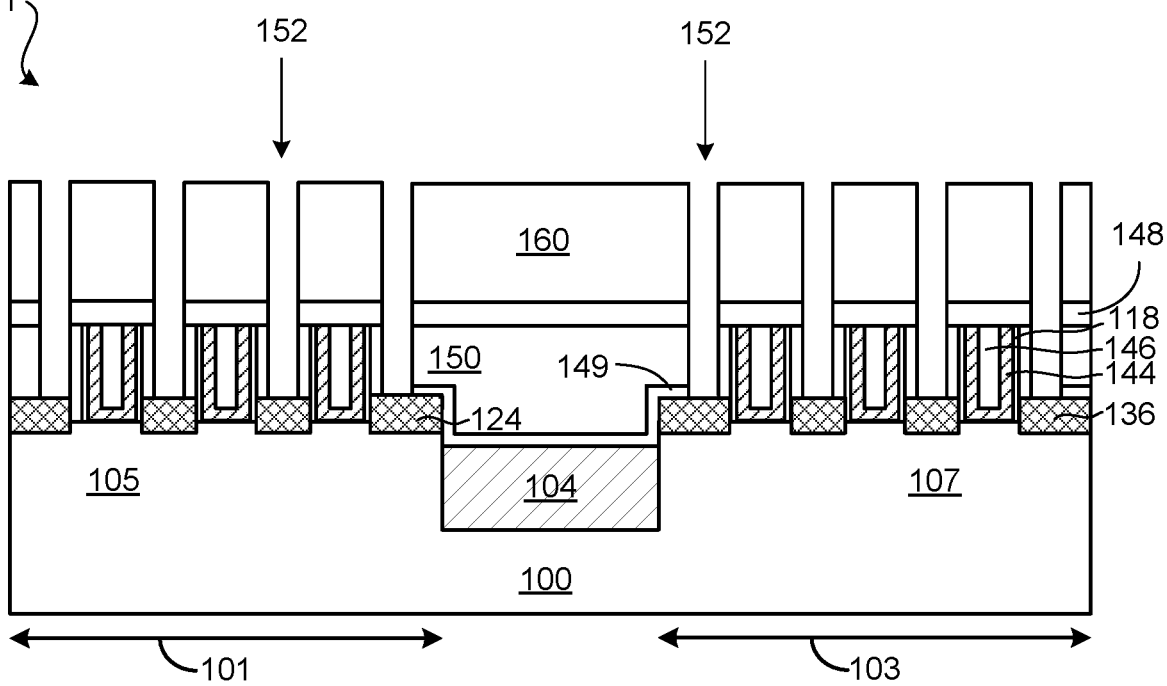
Figure 1C:
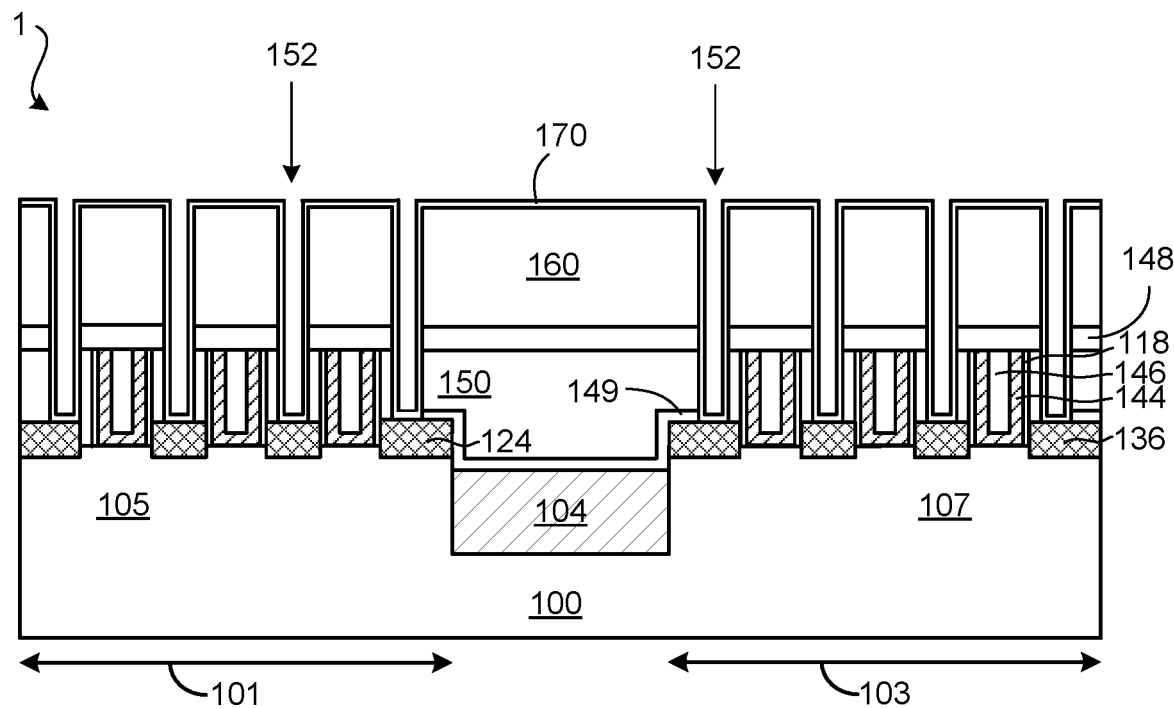
Figure 1D:
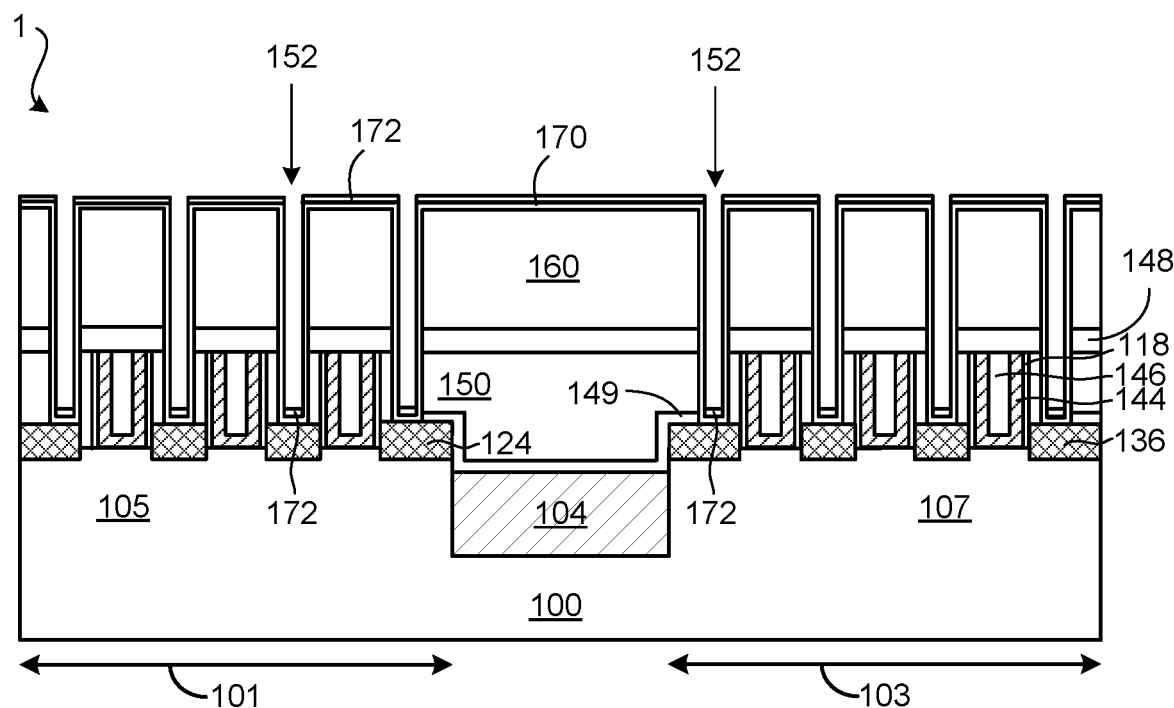

FIG. 1B shows the substrate 1 following a self-aligned contact etching process that is performed to form recessed features 152 down to the first n-type doped epitaxial semiconductor material 124 in the NFET region 101 and the second p-type doped epitaxial material 136 in the PFET region 103. FIG. 1C shows the substrate 1 following deposition of a first n-type metal contact 170 (e.g., a Ti metal) in the recessed features 152, and FIG. 1D shows the substrate 1 following non-conformal deposition of first metal nitride 172 in the recessed features 152. The first metal nitride can contain TaN or TiN.

Figure 1E:
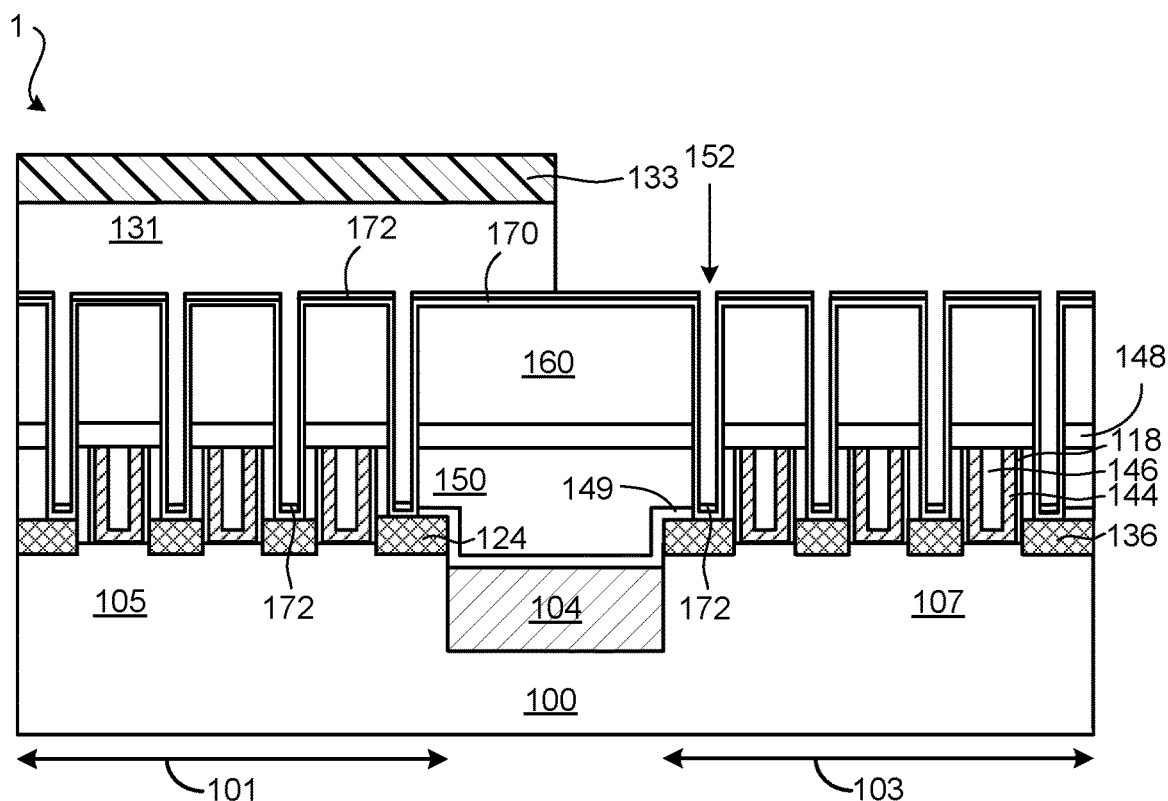
Figure 1F:
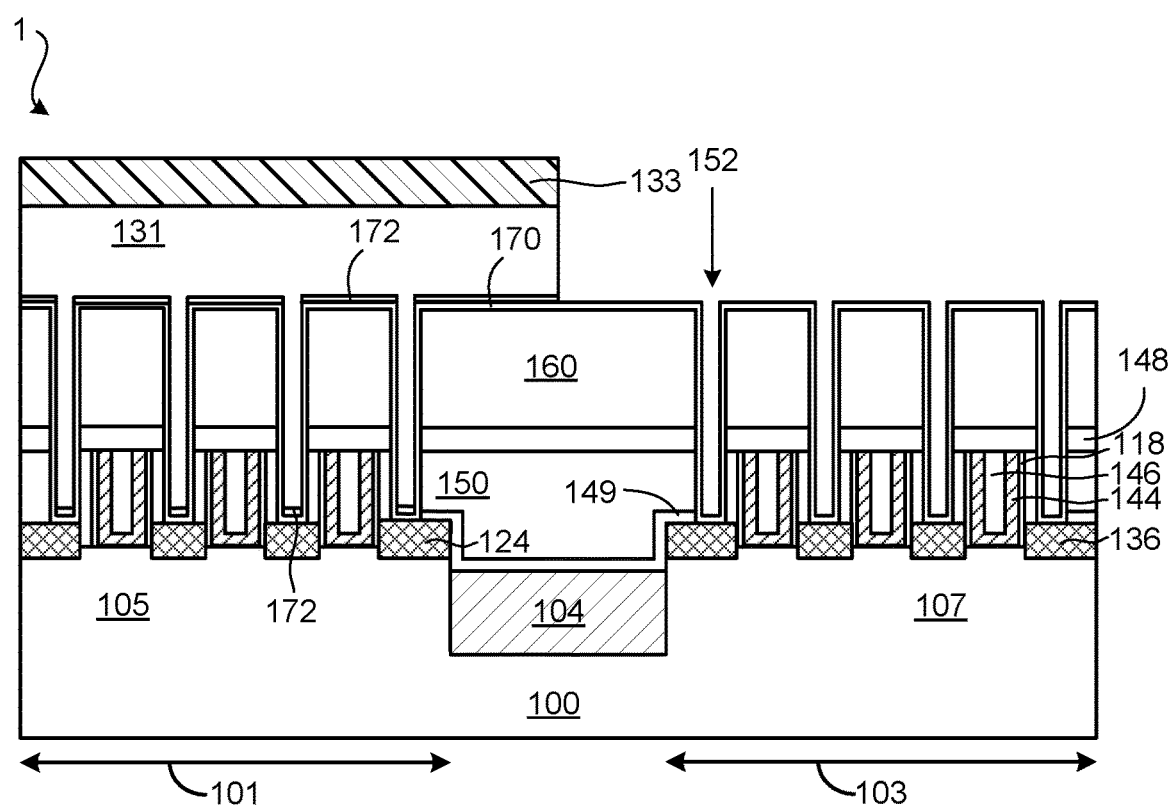
Figure 1G:
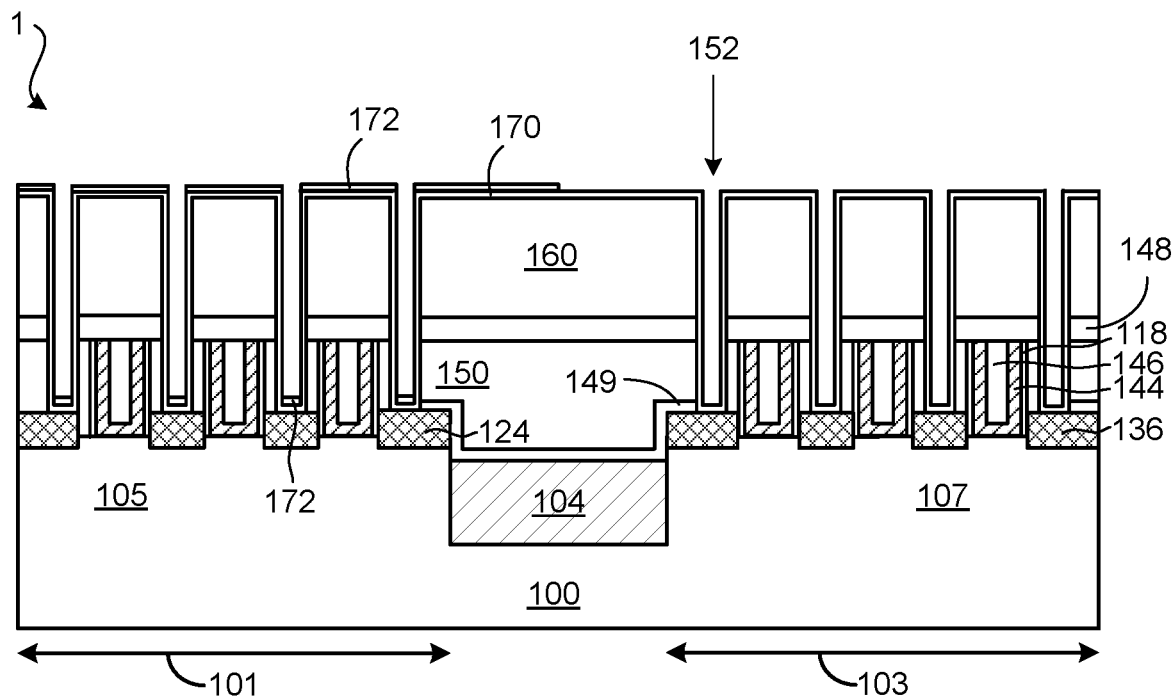

FIG. 1E shows an organic layer 131 that is deposited and patterned using a patterned photoresist layer 133 to cover the NFET region 101. In some examples, the organic layer 131 can include an organic planarization layer (OPL) or an organic dielectric layer (ODL). FIG. 1F further shows the substrate 1 following a reactive ion etching (RIE) process that removes the metal nitride 172 from the PFET region 103, while the metal nitride 172 in the NFET region 101 is protected from the RIE by the organic layer 131 that functions as a blocking layer. FIG. 1G shows the substrate 1 following removal of the organic layer 131 and the patterned photoresist layer 133 from the NFET region 101.

Figure 1H:
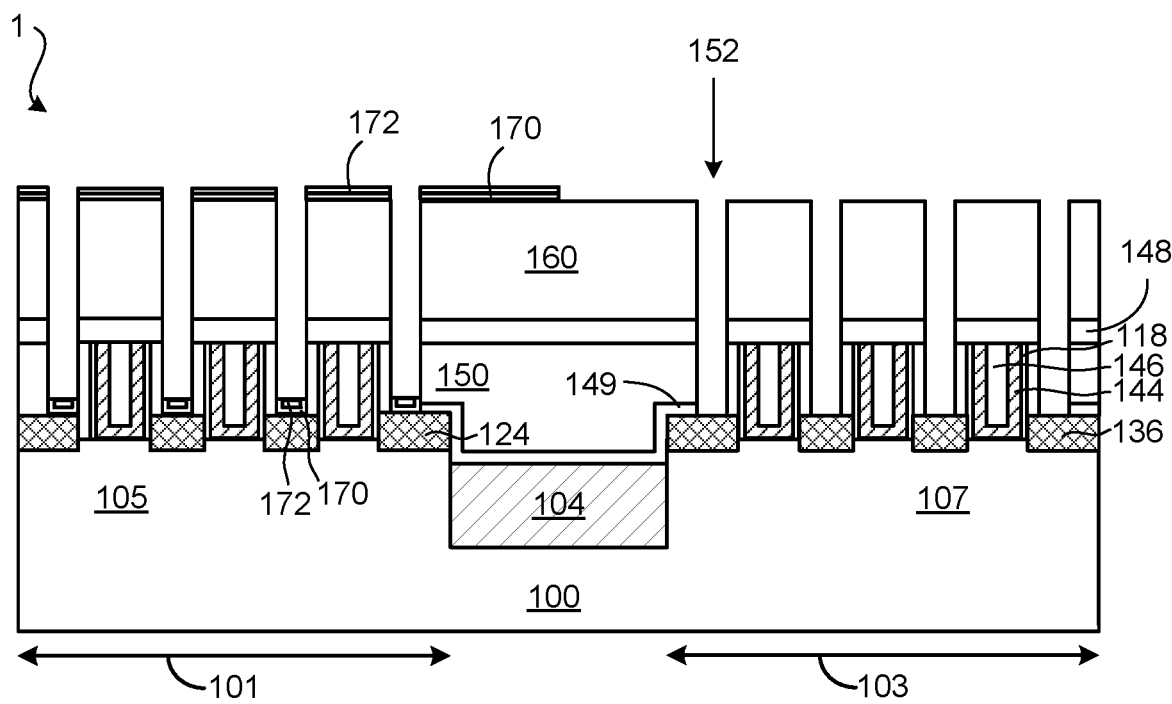

FIG. 1H shows the substrate 1 following an etching process that removes the first n-type metal contact 170 from the PFET region 103 and from the sidewalls of the recessed features 152 in the NFET region 101. The portion of the first n-type metal contact 170 on the first n-type doped epitaxial semiconductor material 124 is protected by the metal nitride 172.

Figure 1I:
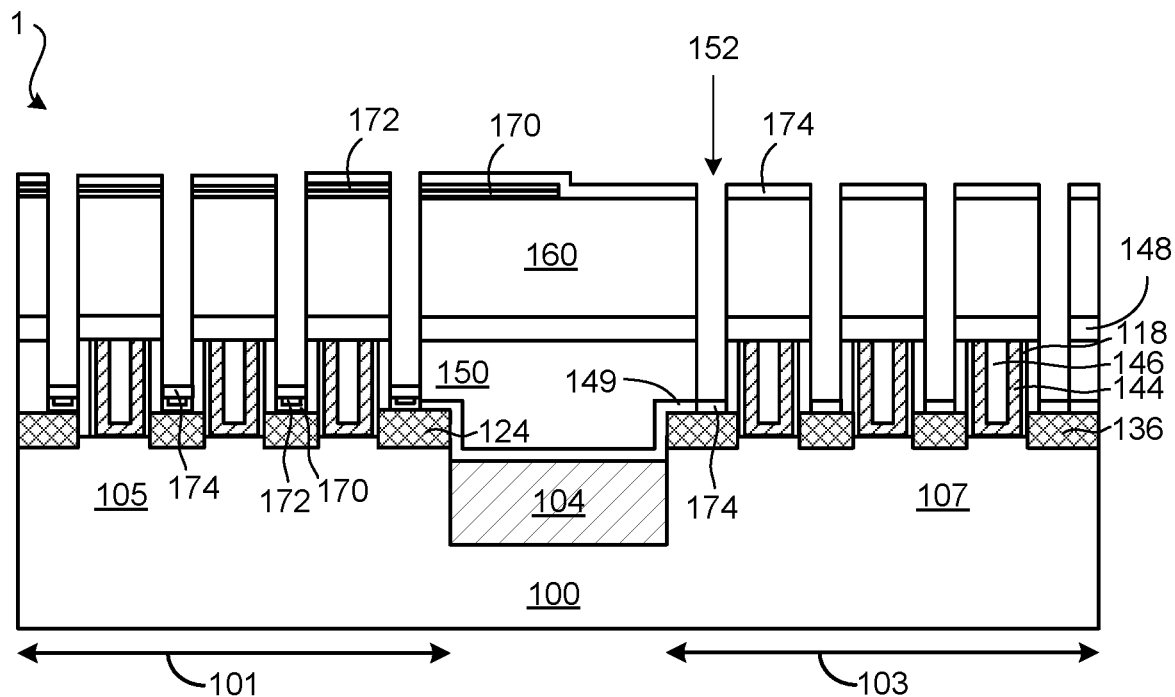
Figure 1J:
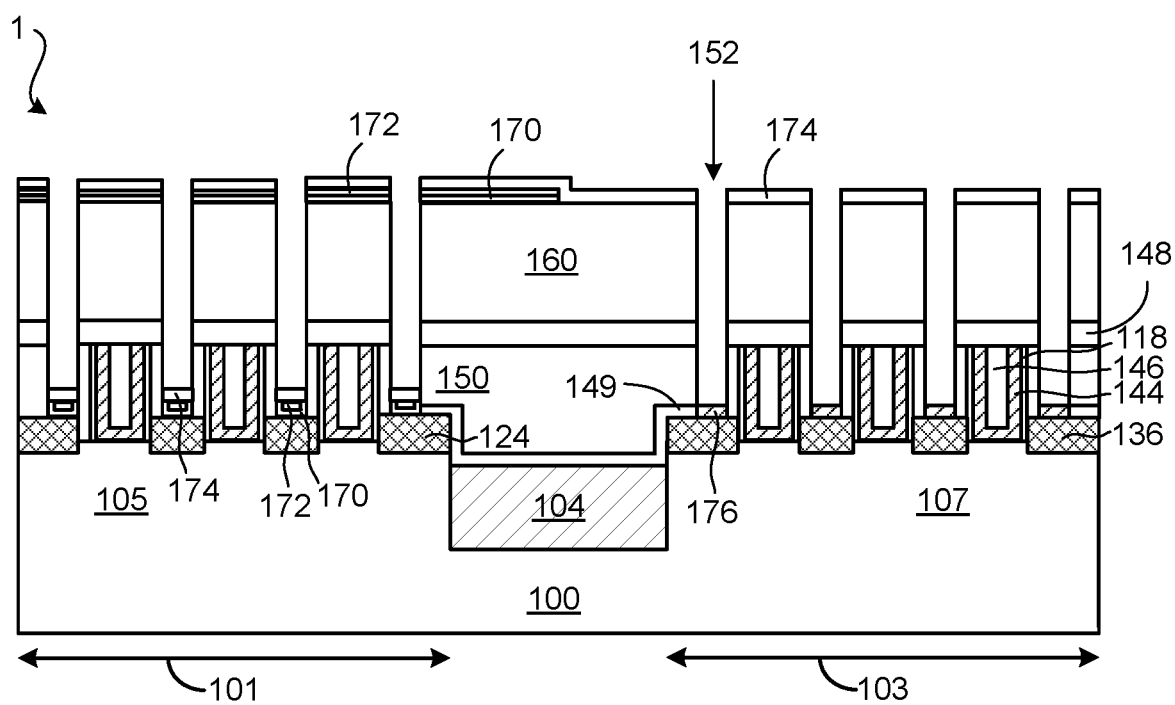

FIG. 1I shows the substrate 1 following non-conformal deposition of a second p-type metal contact 174 (e.g., a ruthenium (Ru) metal) in the NFET region 101 and in the PFET region 103, and FIG. 1J shows the substrate 1 following an annealing process that forms a metal silicide 176 (e.g., a ruthenium silicide ($RuSi_x$)) by a reaction between the second p-type metal contact 174 and the second p-type doped epitaxial semiconductor material 136 in the PFET region 103. In one example, the annealing process may be performed at about 450° C., or lower.

Figure 1K:
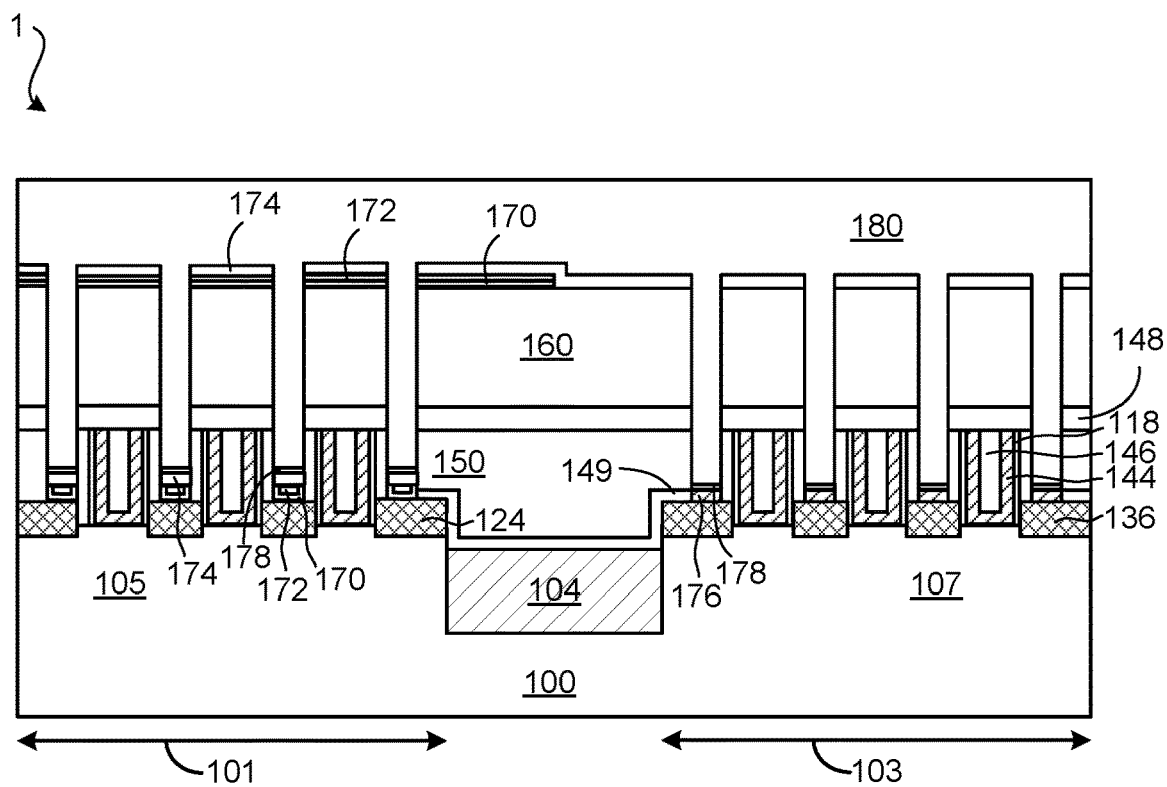
Figure 1L:
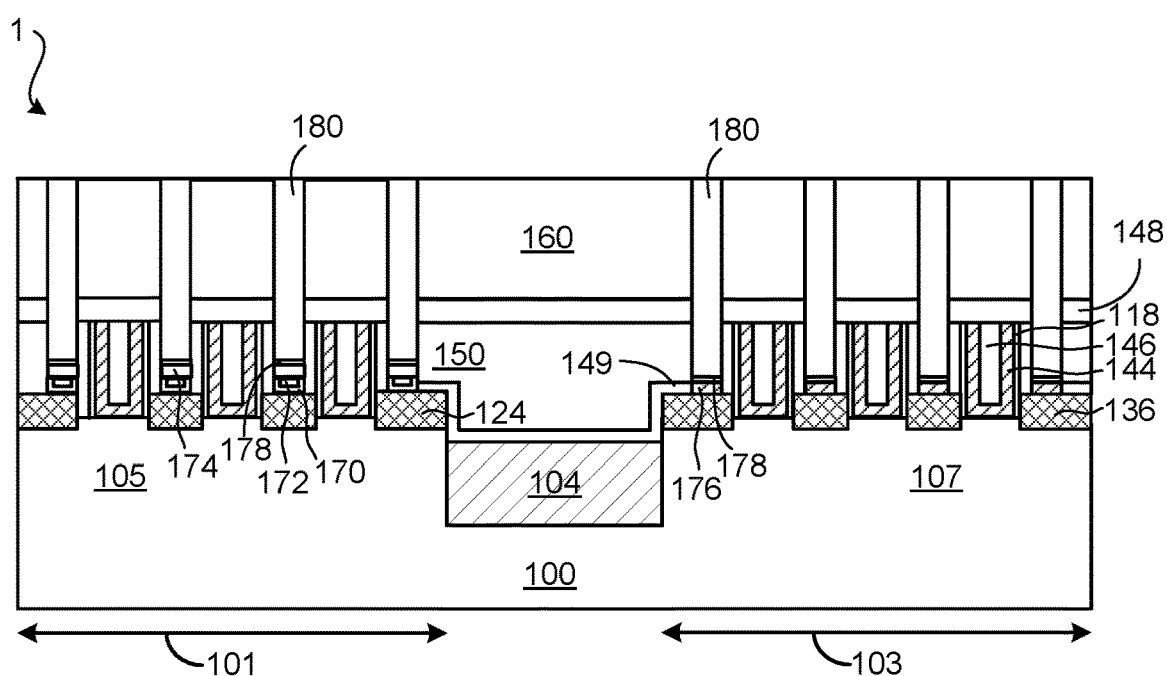

FIG. 1K shows the substrate 1 following deposition of a thin second metal nitride 178 in the recessed features 152. The second metal nitride 178 can contain TaN or TiN, and can have a thickness of about 1 nm, or less. Further, a conformal Ru metal layer 180 is deposited on the substrate 1 and forms a first Ru metal plug in the recessed features 152 in the NFET region 101 and a second Ru metal plug in the recessed features 152 in the PFET region 103. Thereafter, as shown in FIG. 1L, the Ru metal layer 180 is planarized.

A plurality of embodiments for dual metal contacts with Ru metal plugs in aggressively scaled devices have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
    providing a patterned substrate containing a first etched feature connecting to a first n-type doped epitaxial semiconductor material at the bottom of the first etched feature and a second etched feature connecting to a second p-type doped epitaxial material at the bottom of the second etched feature;
    conformally depositing first n-type metal contact containing titanium (Ti) metal layer in the first and second etched features, including on the first n-type doped epitaxial semiconductor material and the second p-type doped epitaxial semiconductor materiels;
    non-conformally depositing a first metal nitride on the first n-type metal contact in the first and second etched features;
    selectively forming a blocking layer on the first etched feature but not on the second etched feature;
    removing the first metal nitride from the second etched feature;
    removing the blocking layer from the first etched feature;
    removing the first n-type metal contact from the second etched feature while retaining the first n-type metal contact on the first n-type doped epitaxial semiconductor material underneath the first metal nitride at the bottom of the first etched feature;
    non-conformally depositing a second p-type metal contacting the first and second etched features;
    annealing the patterned substrate to at least partly form a metal silicide at the bottom of the second etched feature;
    depositing a second metal nitride on the metal silicide; and
    filling the first and second etched features with Ru metal plugs.

2. The method of claim 1, wherein the first metal nitride includes TaN or TiN.

3. The method of claim 1, wherein the second metal nitride includes TaN or TiN.

4. The method of claim 1, wherein the first n-type doped epitaxial semiconductor material includes Si:P or Si:As.

5. The method of claim 1, wherein the second p-type doped epitaxial semiconductor material includes SiGe:B.

6. The method of claim 1, wherein the second p-type metal contact contains Ru or $RuSi_x$.

* * * * *